US011417525B2

(12) United States Patent
O'Toole et al.

(10) Patent No.: US 11,417,525 B2
(45) Date of Patent: Aug. 16, 2022

(54) MULTIPLE PATTERNING WITH MANDREL CUTS DEFINED BY BLOCK MASKS

(71) Applicant: GLOBALFOUNDRIES U.S. Inc., Santa Clara, CA (US)

(72) Inventors: Martin O'Toole, Saratoga Springs, NY (US); Keith Donegan, Saratoga Springs, NY (US); Brendan O'Brien, Ballston Spa, NY (US); Hsueh-Chung Chen, Cohoes, NY (US); Terry A. Spooner, Halfmoon, NY (US); Craig Child, Gansevoort, NY (US); Sean Reidy, Clifton Park, NY (US); Ravi Prakash Srivastava, Clifton Park, NY (US); Louis Lanzerotti, Charlotte, VT (US); Atsushi Ogino, Fishkill, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 281 days.

(21) Appl. No.: 16/154,284

(22) Filed: Oct. 8, 2018

(65) Prior Publication Data
US 2020/0111668 A1   Apr. 9, 2020

(51) Int. Cl.
*H01L 21/311* (2006.01)
*H01L 21/308* (2006.01)
(Continued)

(52) U.S. Cl.
CPC .... *H01L 21/0337* (2013.01); *H01L 21/31111* (2013.01); *H01L 21/31144* (2013.01); *H01L 21/76816* (2013.01)

(58) Field of Classification Search
CPC .......................... H01L 21/31144; H01L 21/308
See application file for complete search history.

(56) References Cited

U.S. PATENT DOCUMENTS 5,348,897 A * 9/1994 Yen ..................... H01L 27/1108
438/152
5,976,944 A * 11/1999 Czagas ................... H01L 28/24
257/E21.006

(Continued)

OTHER PUBLICATIONS

Ravi Prakash Srivastava et al., "Multiple Patterning With Lithographically-Defined Cuts" filed Oct. 8, 2018 as U.S. Appl. No. 16/154,306.

(Continued)

*Primary Examiner* — Thomas T Pham
(74) *Attorney, Agent, or Firm* — Thompson Hine LLP; Anthony Canale

(57) ABSTRACT

Methods of self-aligned multiple patterning. A hardmask is deposited over an interlayer dielectric layer. A mandrel is formed over the hardmask. A block mask is formed that covers a first lengthwise section of the mandrel and that exposes second and third lengthwise sections of the mandrel. After forming the block mask, the second and third lengthwise sections of the mandrel are removed to define a pattern including respective first and second mandrel lines that are separated from each other by the first lengthwise section of the mandrel. The first mandrel line and the second mandrel line expose respective portions of the hardmask, and the first lengthwise section of the mandrel line covers another portion of the hardmask. The pattern is transferred to the hardmask with an etching process, and subsequently transferred to the interlayer dielectric layer with another etching process.

8 Claims, 15 Drawing Sheets

(51) Int. Cl.
*H01L 21/033* (2006.01)
*H01L 21/768* (2006.01)

(56) References Cited

U.S. PATENT DOCUMENTS

| | | | |
|---|---|---|---|
| 8,455,364 B2 | 6/2013 | Kanakasabapathy | |
| 8,741,763 B2 | 6/2014 | Ma et al. | |
| 8,921,225 B2 | 12/2014 | Yuan et al. | |
| 9,818,641 B1 | 11/2017 | Bouche et al. | |
| 9,941,164 B1* | 4/2018 | Kim | H01L 21/31144 |
| 10,395,926 B1* | 8/2019 | Tang | H01L 21/0332 |
| 2007/0049011 A1* | 3/2007 | Tran | H01L 21/0338 |
| | | | 438/637 |
| 2009/0050603 A1* | 2/2009 | Heo | H01L 21/0335 |
| | | | 216/47 |
| 2010/0067146 A1* | 3/2010 | Kajitani | G11B 5/10 |
| | | | 360/235.4 |
| 2012/0280290 A1* | 11/2012 | Khakifirooz | H01L 29/6659 |
| | | | 257/288 |
| 2014/0225252 A1* | 8/2014 | Lin | H01L 21/76816 |
| | | | 257/737 |
| 2015/0056800 A1* | 2/2015 | Mebarki | H01L 21/32139 |
| | | | 438/652 |
| 2020/0083426 A1* | 3/2020 | Yang | H01L 21/76802 |

OTHER PUBLICATIONS

Hsueh-Chung Chen et al., "Multiple Patterning With Late Lithographically-Defined Mandrel Cuts" filed Oct. 8, 2018 as U.S. Appl. No. 16/154,237.

* cited by examiner

MULTIPLE PATTERNING WITH MANDREL CUTS DEFINED BY BLOCK MASKS

BACKGROUND

The present invention relates to semiconductor device fabrication and integrated circuits and, more specifically, to methods of self-aligned multiple patterning.

A back-end-of-line interconnect structure may be used to connect device structures, which were fabricated on a substrate during front-end-of-line processing, with each other and with the environment external to the chip. Self-aligned patterning processes used to form an interconnect structure involve linear mandrels acting as sacrificial features that establish a feature pitch. Non-mandrel lines are arranged as linear spaces between sidewall spacers that are formed adjacent to the sidewalls of the mandrels. After the mandrels are pulled to define mandrel lines, the sidewall spacers are used as an etch mask to etch a pattern predicated on the mandrel lines and the non-mandrel lines into an underlying hardmask. The pattern is subsequently transferred from the hardmask to an interlayer dielectric layer as trenches in which the interconnects are formed.

Mandrel cuts may be formed in the mandrels in order to section the mandrels and define discontinuities between the different sections. Non-mandrel cuts may also be formed along non-mandrel lines and may include portions of the spacer material used to form the sidewall spacers. The mandrel cuts and non-mandrel cuts are included in the pattern that is transferred to the hardmask and subsequently transferred from the hardmask to form the trenches in the interlayer dielectric layer. The mandrel cuts and non-mandrel cuts appear in the interconnect structure as adjacent interconnects that are spaced apart at their tips with a tip-to-tip spacing related to the dimension of the discontinuity.

The tip-to-tip spacing for the sections of a cut mandrel is limited to a distance equal to twice the thickness of the sidewall spacers. If the tip-to-tip spacing is greater than this distance, the sidewalls spacers do not merge between the tips of the sections of the mandrel, which results in incomplete filling of the mandrel cut. Transverse to the length of the cut mandrel, the mandrel cut is arranged in the pattern laterally between non-mandrel lines that flank the cut mandrel line. The result of the incomplete filling can be a conductive link shorting interconnects formed using the non-mandrel lines flanking the mandrel cut.

Even if the filling of the mandrel cut is complete, the wrapping of the sidewall spacers about the tips of the sections of the cut mandrel may introduce notches or indents at the side edges of the merged sidewall spacers. These notches or indents appear in the interconnect structure as kinks that project from the side edges of wires formed using the non-mandrel lines flanking the mandrel cut. The proximity of these kinks to each other may also result in shorting.

Improved methods of self-aligned multiple patterning are therefore needed.

SUMMARY

In an embodiment of the invention, a method includes depositing a hardmask over an interlayer dielectric layer, forming a mandrel over the hardmask, and forming a block mask that covers a first lengthwise section of the mandrel and that exposes a second lengthwise section of the mandrel and a third lengthwise sections of the mandrel. After forming the block mask, the second lengthwise section and the third lengthwise section of the mandrel are removed to define a pattern including a first mandrel line and a second mandrel line that is separated from the first mandrel line by the first lengthwise section of the mandrel. The first mandrel line and the second mandrel line expose respective portions of the hardmask, and the first lengthwise section of the mandrel line covers another portion of the hardmask. The method further includes transferring the pattern to the hardmask with an etching process.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

FIG. 1A is a top view of the structure at the fabrication stage of FIG. 1 in which FIG. 1 is taken generally along line 1-1.

FIG. 7A is a top view of the structure at the fabrication stage of FIG. 7 in which FIG. 7 is taken generally along line 7-7.

FIG. 14 is a top view of the structure in which FIG. 13 is taken generally along line 13-13.

FIG. 21A is a top view of the structure at the fabrication stage of FIG. 21 in which FIG. 21 is taken generally along line 21-21.

DETAILED DESCRIPTION

Figure 1:
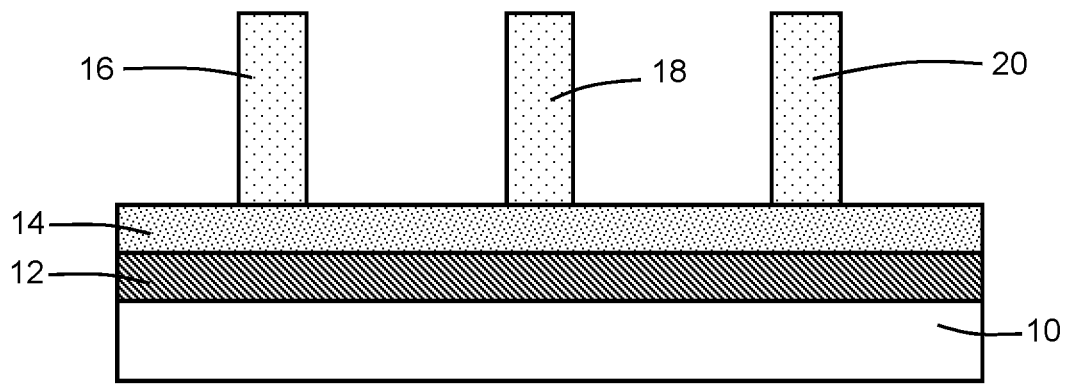
FIGS. 1-8 are cross-sectional views of a structure at successive fabrication stages of a processing method in accordance with embodiments of the invention.
Figure 1A:
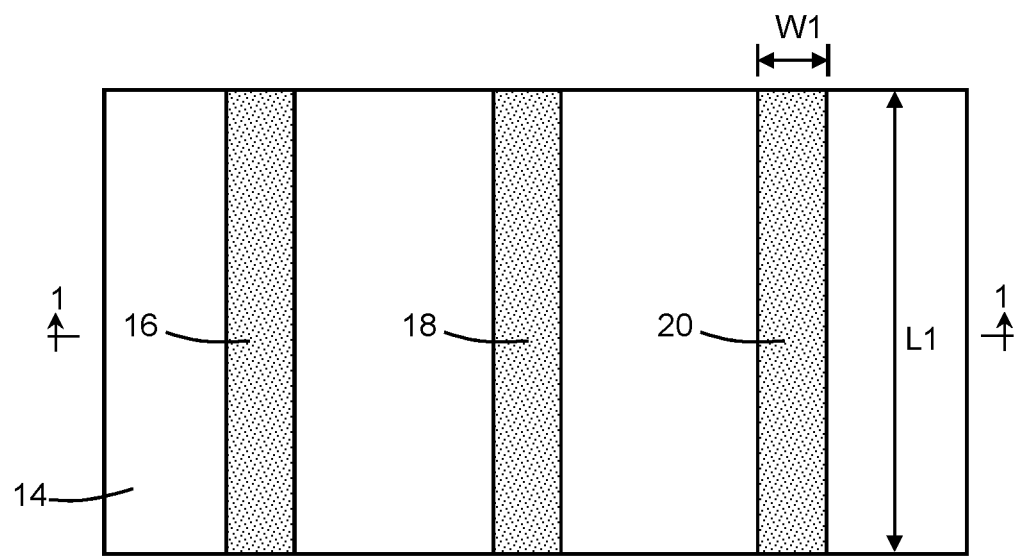

With reference to FIGS. 1, 1A and in accordance with embodiments of the invention, an interlayer dielectric layer 10 may be composed of one or more electrically-insulating dielectric materials, such as a low-k dielectric material formed using a siloxane such as octamethylcyclotetrasiloxane (OMCTS). The interlayer dielectric layer 10 may be located on a substrate that includes device structures fabricated by front-end-of-line (FEOL) processing to form an integrated circuit. A layer stack including a hardmask 12 and a hardmask 14 is arranged over the interlayer dielectric layer 10 with the hardmask 12 arranged in a vertical direction between the interlayer dielectric layer 10 and the hardmask 14. The layer stack may include an additional hardmask (not shown) composed of a dielectric material, such as silicon-oxygen nitride, between the hardmask 12 and the interlayer dielectric layer 10.

The hardmasks 12, 14 are used to perform pattern transfer to the interlayer dielectric layer 10 during a self-aligned multiple patterning process, such as self-aligned double patterning (SADP). The hardmasks 12, 14 are composed of different materials characterized by dissimilar etch selectivities. The hardmask 12 may be composed of, for example, titanium nitride (TiN) or titanium oxide ($TiO_x$) deposited by, for example, physical vapor deposition (PVD), atomic layer deposition (ALD), or chemical vapor deposition (CVD). The hardmask 14 is removable from the hardmask 12 selective to the material of the hardmask 12, and the hardmask 12 is removable from the interlayer dielectric layer 10 selective to the material of the interlayer dielectric layer 10. The hardmask 14 may be composed of a dielectric material, such as silicon nitride (SiN), deposited by, for example, atomic layer deposition (ALD) or chemical vapor deposition (CVD). As used herein, the terms "selective" and "selectivity" in reference to a material removal process (e.g., etching) denotes that the material removal rate (i.e., etch rate) for the targeted material is higher than the material removal rate (i.e., etch rate) for at least another material exposed to the material removal process.

Mandrels 16, 18, 20 are formed from a layer that is deposited on a top surface of the hardmask 14. For example, lithography and etching processes may be used to pattern an etch mask with an etching process, which is used in turn to pattern the mandrels 16, 18, 20 with another etching process. The layer used to form the mandrels 16, 18, 20 may be composed of amorphous silicon (α-Si), amorphous carbon (α-C), or a spin-on hardmask (SOH). The etch mask used to pattern the mandrels 16, 18, 20 may be removed after patterning the mandrels 16, 18, 20. Each of the mandrels 16, 18, 20 has a length, L1, and a width, W, in a direction transverse to the length, L1.

Figure 2:
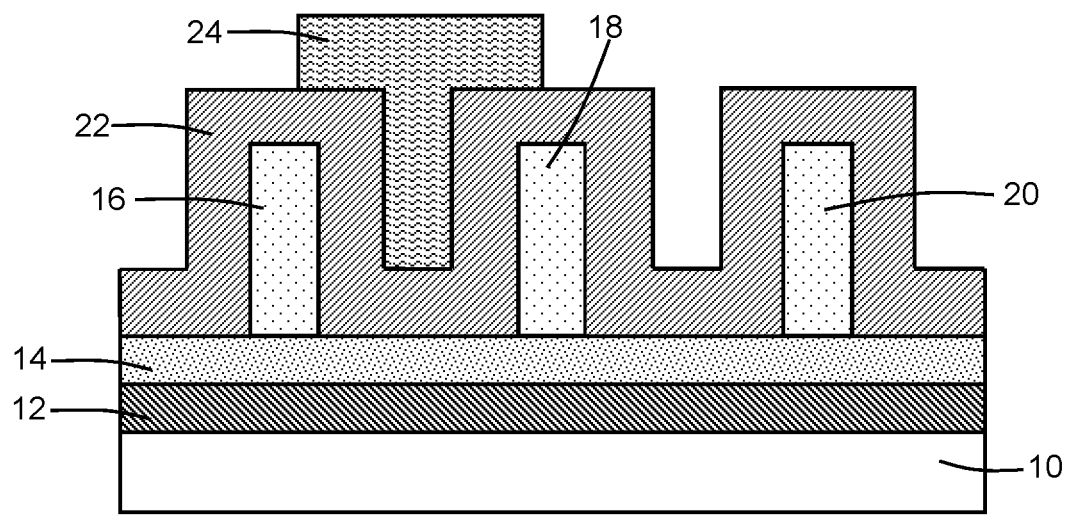

With reference to FIG. 2 in which like reference numerals refer to like features in FIG. 1 and at a subsequent fabrication stage of the processing method, a conformal spacer layer 22 composed of a dielectric material is subsequently deposited using, for example, atomic layer deposition (ALD). The material constituting the conformal spacer layer 22 may be chosen so as to be removed by a given etch chemistry selective to the material of the mandrels 16, 18, 20. For example, if the mandrels 16, 18, 20 are composed of amorphous silicon, the dielectric material constituting the conformal spacer layer 22 may be composed of such as titanium oxide ($TiO_x$) or silicon dioxide ($SiO_2$).

After the conformal spacer layer 22 is deposited, a pillar 24 is formed that covers a section of the conformal spacer layer 22 generally arranged between the mandrel 18 and the mandrel 20. The pillar 24 may be composed of a spin-on hardmask that is composed of an organic material, such as a polymer or an organic planarization material (OPL), or another material, and that is patterned by with lithography and etching processes. The pillar 24 provides a mechanism for forming a non-mandrel cut that ultimately appears as a tip-to-tip cut between subsequently-formed interconnects. The material constituting the conformal spacer layer 22 may also be chosen so as to be removed by a given etch chemistry selective to the material of the pillar 24.

Figure 3:
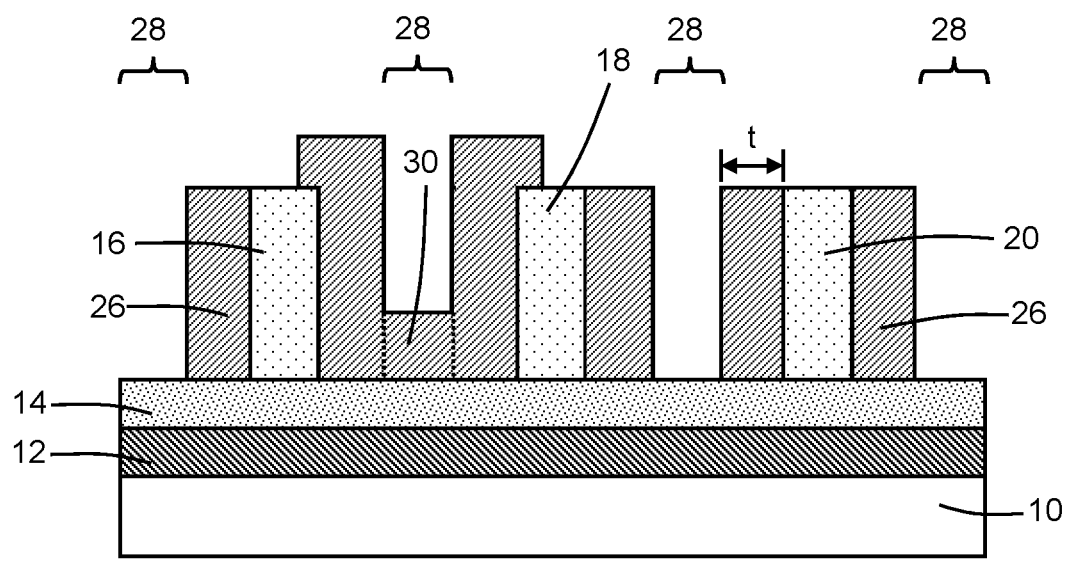

With reference to FIG. 3 in which like reference numerals refer to like features in FIG. 2 and at a subsequent fabrication stage of the processing method, sidewall spacers 26 are formed from the conformal spacer layer 22 at locations adjacent to the vertical sidewalls of the mandrels 16, 18, 20. The sidewall spacers 26 may be formed by shaping the conformal spacer layer 22 with an anisotropic etching process, such as reactive ion etching (ME), that removes the material of the conformal spacer layer 22 selective to the materials of the hardmask 14, the mandrels 16, 18, 20, and the pillar 24. The sidewall spacers 26 have a thickness, t, that may be nominally equal to the thickness of the conformal spacer layer 22.

Non-mandrel lines 28 are defined as linear spaces arranged between the sidewall spacers 26 on the mandrels 16, 18, 20 and over which areas of the hardmask 14 are revealed. A portion of the dielectric material of the conformal spacer layer 22 masked by the pillar 24 during the anisotropic etching process provides a non-mandrel cut mask 30 that is arranged along the length of one of the non-mandrel lines 28. The non-mandrel cut mask 30 is in direct contact with the hardmask layer 14. Following the anisotropic etching process, the pillar 24 may be removed by, for example, ashing with a plasma.

Figure 4:
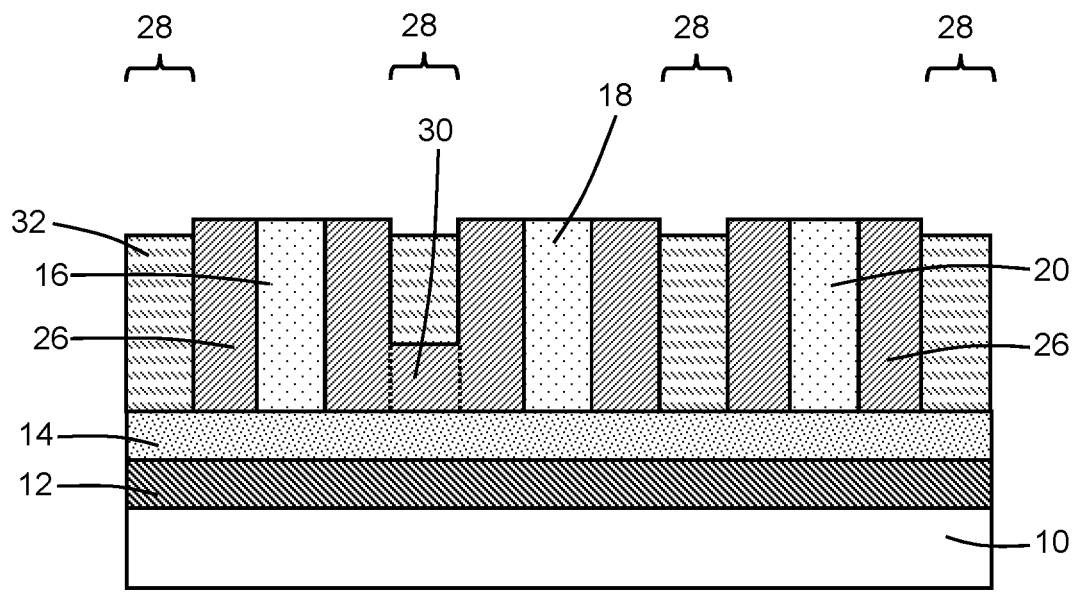

With reference to FIG. 4 in which like reference numerals refer to like features in FIG. 3 and at a subsequent fabrication stage of the processing method, a spin-on hardmask 32 is applied and recessed to fill the non-mandrel lines 28. The spin-on hardmask 32 may be composed of an organic material, such as a polymer. After the spin-on hardmask 32 is formed, portions of the conformal spacer layer 22 over the mandrels 16, 18, which were partially covered by the pillar 24 during spacer formation, are removed by an etching process. The non-mandrel cut mask 30 is protected by the spin-on hardmask 32 during the etching process.

Figure 5:
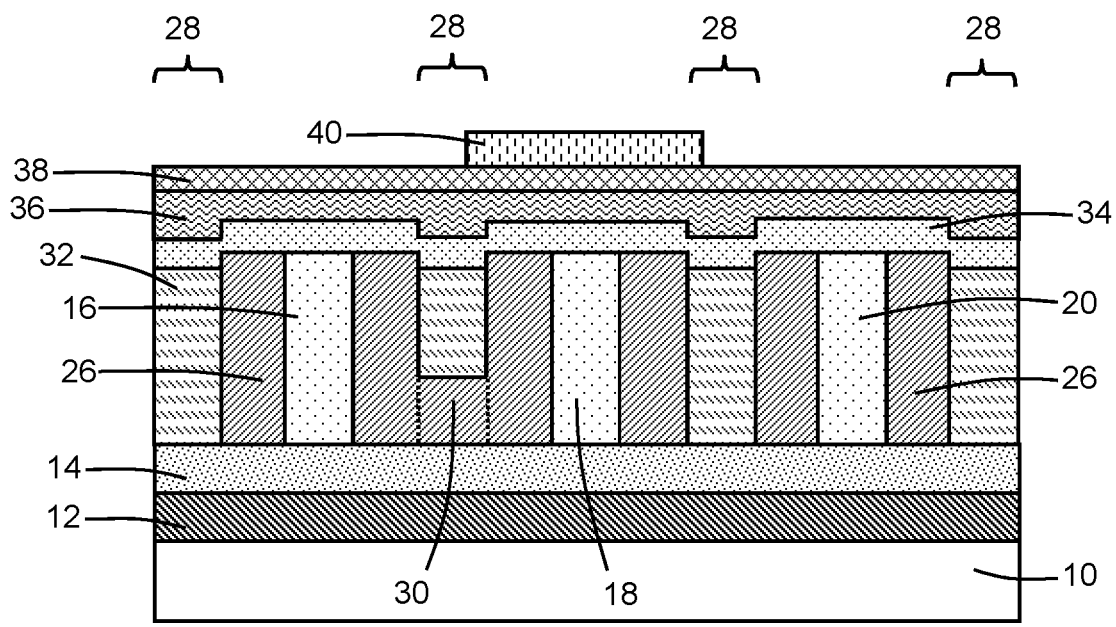

With reference to FIG. 5 in which like reference numerals refer to like features in FIG. 4 and at a subsequent fabrication stage of the processing method, a mask layer 34 composed of a dielectric material, such as a low-temperature oxide (LTO) of silicon, is formed over the mandrels 16, 18, 20, sidewall spacers 26, and spin-on hardmask 32. The mask layer 34 may be conformally deposited by atomic layer deposition.

A patterning layer 36 composed of an organic planarization layer (OPL) material, and a hardmask layer 38 composed of a dielectric material, such as silicon-oxygen nitride (SiON), are formed over the mask layer 34. An etch mask 40, which has a width and a length transverse to the width, is formed over the layers 36, 38 by a lithography process. The etch mask 40 covers an area of commensurate dimensions on a top surface of the hardmask layer 38 that is arranged over a lengthwise section of the mandrel 18. Only a fraction of the length of the mandrel 18 is lengthwise overlapped by the etch mask 40. The etch mask 40 overlaps in width dimension at its side edges with the sidewall spacers 26 adjacent to the masked (i.e., covered) lengthwise section of the mandrel 18 such that the entire width of the lengthwise section of the mandrel 18 is overlapped. The etch mask 40 may include a layer stack containing a positive-tone photoresist and a bottom anti-reflection coating in which the positive-tone photoresist may be applied as a fluid by a spin coating process, pre-baked, exposed to light projected through a photomask, baked after exposure, and developed with a chemical developer, and in which the bottom anti-reflection coating may be applied before the photoresist is applied and patterned after the photoresist is developed.

Figure 6:
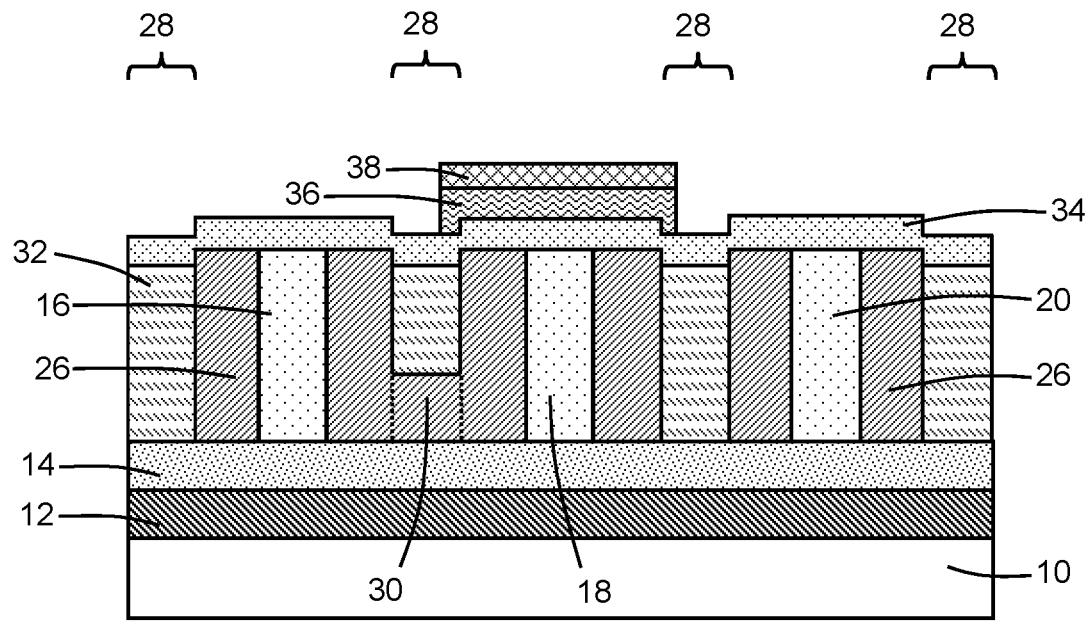

With reference to FIG. 6 in which like reference numerals refer to like features in FIG. 5 and at a subsequent fabrication stage of the processing method, the layers 36, 38 are patterned by one or more etching processes. The etch mask 40 may be removed during the etching process patterning the planarizing layer 36. The patterned layers 36, 38 are arranged over the mask layer 34 and cover an area on the mask layer 34.

Figure 7:
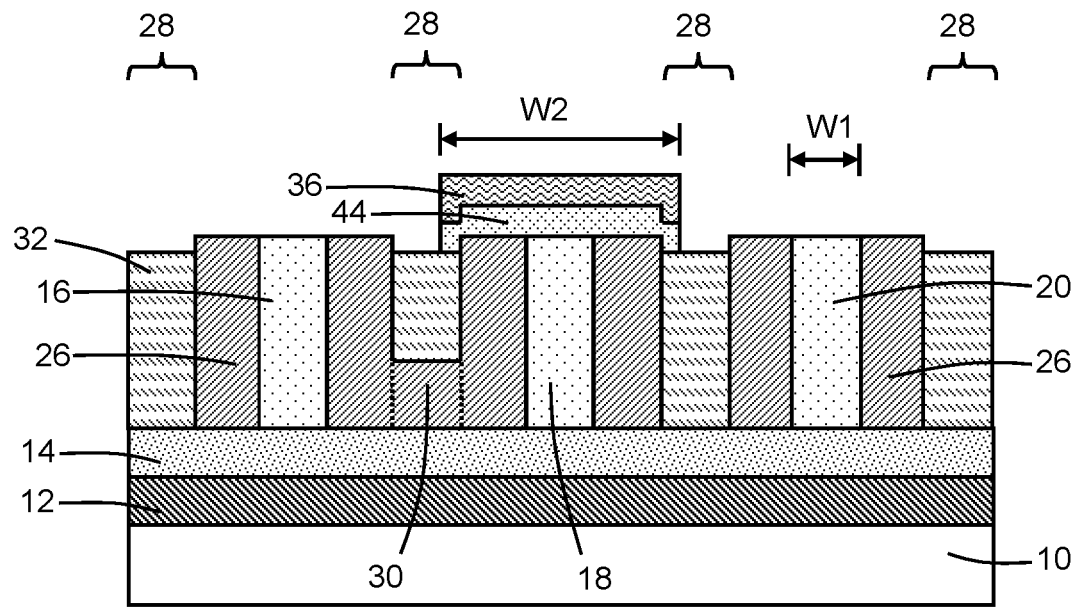
Figure 7A:
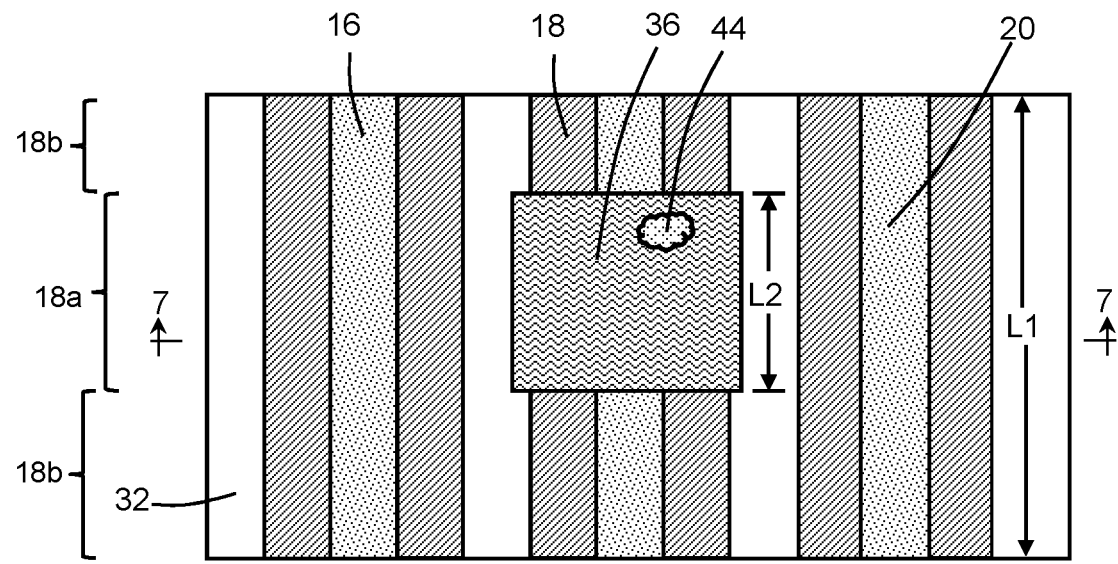

With reference to FIGS. 7, 7A in which like reference numerals refer to like features in FIG. 6 and at a subsequent fabrication stage of the processing method, a block mask 44 is formed by patterning the mask layer 34 using an etching process to remove portions of the mask layer 34 that are not masked by the patterned layers 36, 38. The etching process patterning the mask layer 34 may also remove the hardmask layer 38. The block mask 44, which is composed of the dielectric material of the mask layer 34, is masked by the patterned planarizing layer 36 during the etching process.

The block mask 44 has a width, W2, that is greater than the width, W1, of the mandrel 18 and overlaps in width dimension at its side edges with the sidewall spacers 26 adjacent to the masked (i.e., covered) lengthwise section 18a of the mandrel 18 such that the entire width, W1, of the lengthwise section of the mandrel 18 is overlapped. The block mask 44 has a length, L2, that is less than the length, L1, of the mandrel 18 such that only a fraction of the length of the mandrel 18 is overlapped by the block mask 44 in a lengthwise direction. The etch mask 40 and patterned layers 36, 38 have dimensions commensurate with the size of the block mask 44. The adjacent unmasked lengthwise sections 18b of the mandrel 18 are exposed by the block mask 44, and the masked lengthwise section 18a is arranged along the length of the mandrel 18 between the adjacent unmasked lengthwise sections 18b. The block mask 44 provides a mechanism for forming a mandrel cut that ultimately appears as a tip-to-tip cut between subsequently-formed interconnects.

Figure 8:
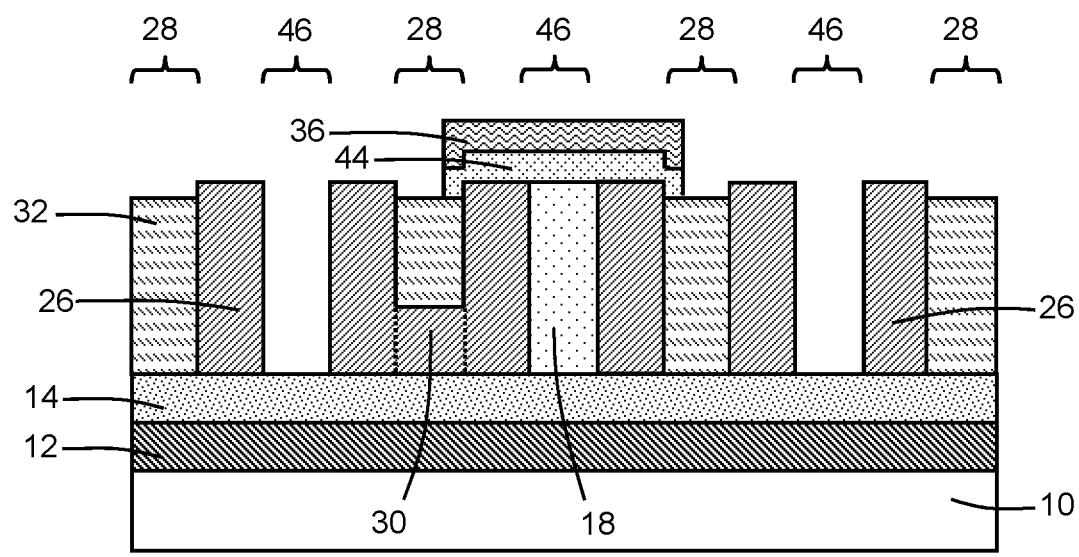

With reference to FIG. 8 in which like reference numerals refer to like features in FIG. 7 and at a subsequent fabrication stage of the processing method, the mandrel 16, the unmasked lengthwise sections 18b (FIG. 7A) of the mandrel 18, and the mandrel 20 are pulled and removed selective to the sidewall spacers 26, the non-mandrel cut mask 30, and the block mask 44 with an etching process having a suitable etch chemistry. Mandrel removal generates mandrel lines 46 that are arranged between the sidewall spacers 26 as linear spaces and over which strips of the hardmask 12 are revealed. The non-mandrel lines 28 and the mandrel lines 46 may have a parallel arrangement and alternate in a direction transverse to their respective lengths.

The block mask 44 masks and covers the lengthwise section 18a (FIG. 7A) of the mandrel 18, which is preserved and not etched, arranged along the length of one of the mandrel lines 46. The block mask 44 and underlying unetched lengthwise section 18a of the mandrel 18 interrupt and cut the continuity of one of the mandrel lines 46, and divide this mandrel line 46 into discrete sections separated by the lengthwise section 18a of the mandrel 18. The sections of the divided mandrel line 46 are exposed by the removal of the lengthwise sections 18b of the mandrel 18.

Figure 9:
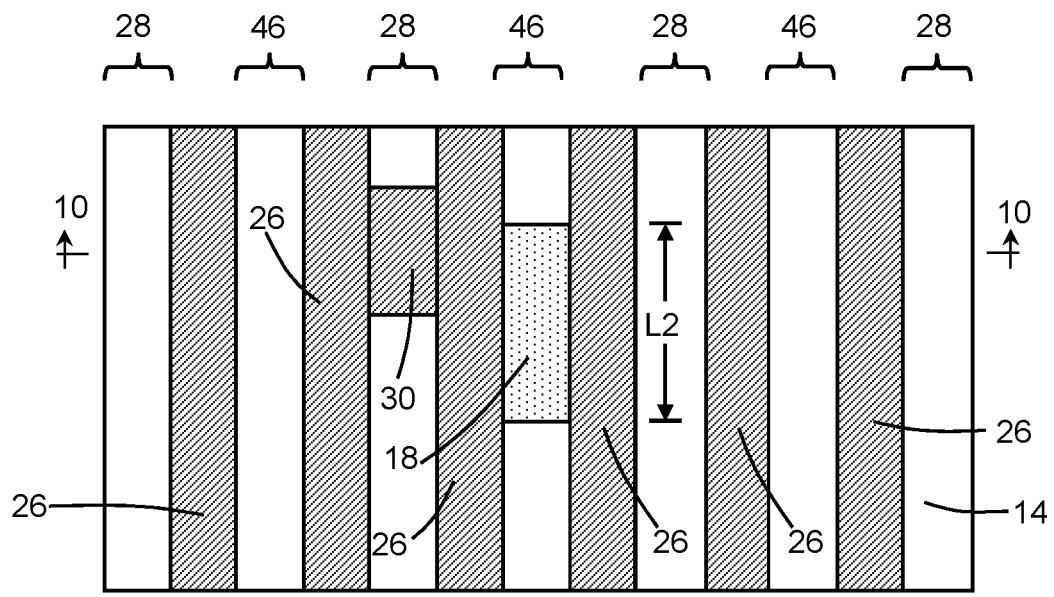
FIG. 9 is a top view of the structure at a fabrication stage of the processing method subsequent to FIG. 8.
Figure 10:
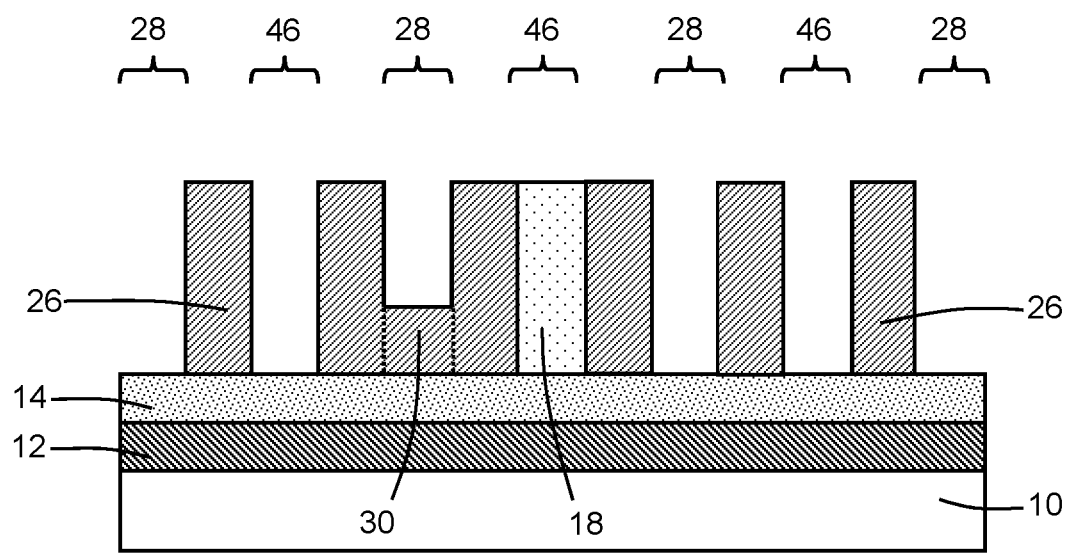
FIG. 10 is a cross-sectional view taken generally along line 10-10 in FIG. 9.

With reference to FIGS. 9, 10 in which like reference numerals refer to like features in FIG. 8 and at a subsequent fabrication stage of the processing method, the spin-on hardmask 32 and patterning layer 36 are removed by, for example, ashing using an oxygen plasma. The block mask 44 is removed with an etching process. The unetched lengthwise section 18a (FIG. 7A) of the mandrel 18, which was covered by the block mask 44, is exposed when the block mask 44 is removed. The unetched lengthwise section 18a of the mandrel 18 subsequently defines the location of a mandrel cut between a pair of linearly-aligned metal interconnects subsequently formed in the interlayer dielectric layer 10 using the sections of the associated mandrel line 46. The length of the unetched lengthwise section 18a of the mandrel 18 (i.e., the length of the removed block mask 44) in a direction parallel to the length, L1, of the sections of the associated mandrel line 46 is equal to the length, L2, and subsequently determines a tip-to-tip space or distance between the tips or ends of the metal interconnects terminating at the unetched lengthwise section 18a of the mandrel 18 and facing each other across the length of the unetched section of the mandrel 18.

The tip-to-tip spacing between the ends of the sections of the cut mandrel line 46, which is defined independent of the formation of the sidewall spacers 26, may be greater than a space equal to twice the thickness of the sidewall spacers 26. The tip-to-tip spacing between the ends of the sections of the cut mandrel line 46 may be varied by selecting the length of the block mask 44, and provides for variable space mandrel cuts that can be produced independent of the spacer thickness. The block mask 44 decouples the formation of the mandrel cut in the mandrel line 46 from the wrapping of the sidewall spacers 26 about the tips of the divided sections of the mandrel 18. As a result, kinking may be eliminated and the probability is reduced that interconnects in the BEOL interconnect structure formed using the non-mandrel lines will be shorted as a consequence of kinking.

Figure 11:
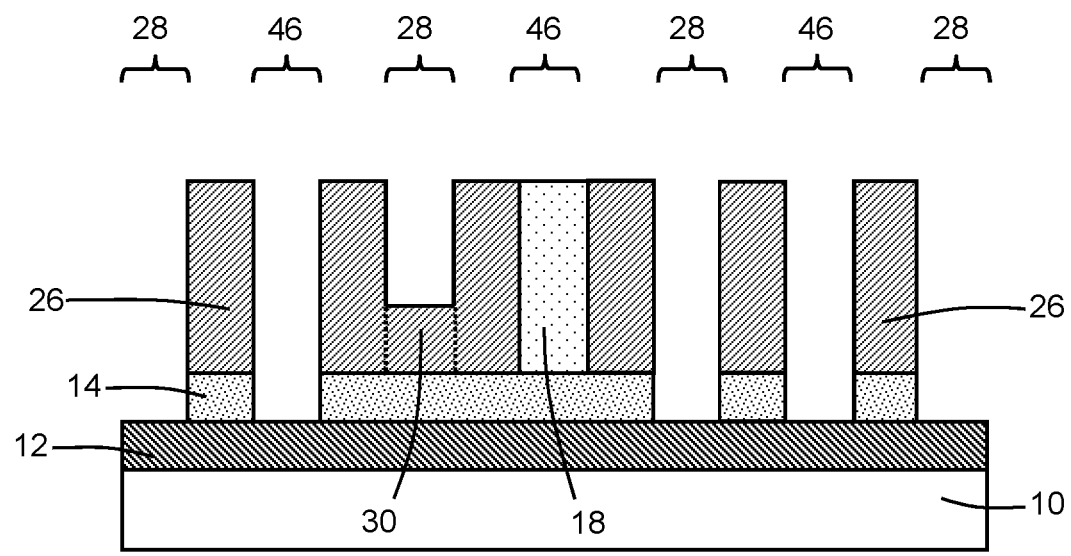
FIGS. 11-13 are cross-sectional views of a structure at successive fabrication stages subsequent to FIG. 10.

With reference to FIG. 11 in which like reference numerals refer to like features in FIG. 10 and at a subsequent fabrication stage of the processing method, the pattern including the non-mandrel lines 28 and mandrel lines 46 is transferred to the hardmask 14 by an etching process. The unetched lengthwise section 18a (FIG. 7A) of the mandrel 18 masks the hardmask 14 over a lengthwise section of one of the mandrel lines 46 and the non-mandrel cut mask 30 masks a lengthwise section of one of the non-mandrel lines 28. The non-mandrel lines 28 and mandrel lines 46 extend through the full thickness of the hardmask 14, and the material of the hardmask 12 may function as an etch stop for the etching process.

Figure 12:
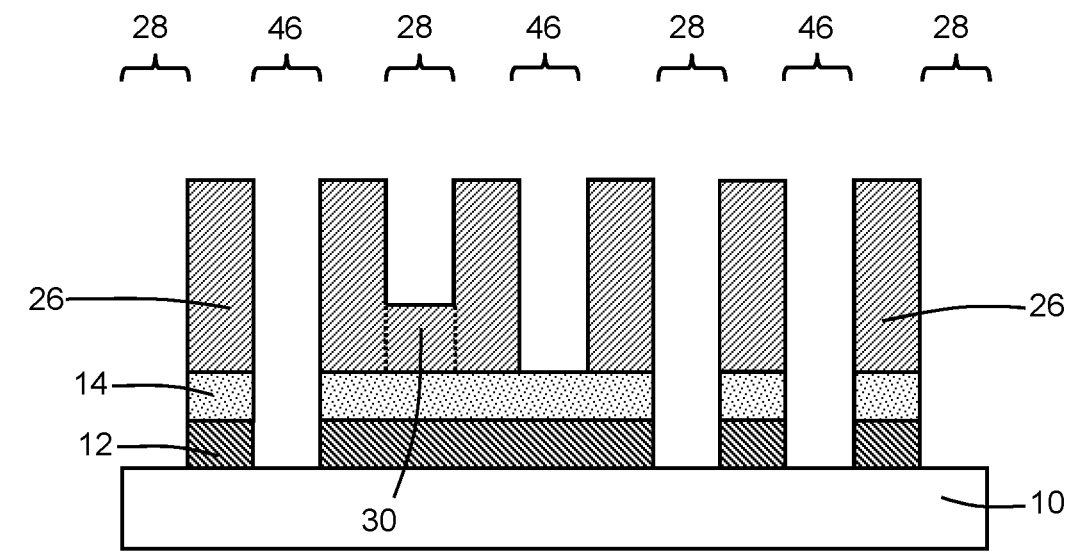

With reference to FIG. 12 in which like reference numerals refer to like features in FIG. 11 and at a subsequent fabrication stage of the processing method, the unetched lengthwise section 18a (FIG. 7A) of the mandrel 18 is removed with an etching process selective to the sidewall spacers 26 and the exposed material of the hardmask 14. The hardmask 12 is then patterned by an etching process to transfer the pattern of non-mandrel lines 28 and mandrel lines 46 with cuts to the hardmask 12. The patterned hardmask 14 operates as an etch mask during pattern transfer. The etching process may stop on the material of the interlayer dielectric layer 10, and the non-mandrel lines 28 and mandrel lines 46 extend through the full thickness of the hardmask 12 other than the locations of the cuts.

Figure 13:
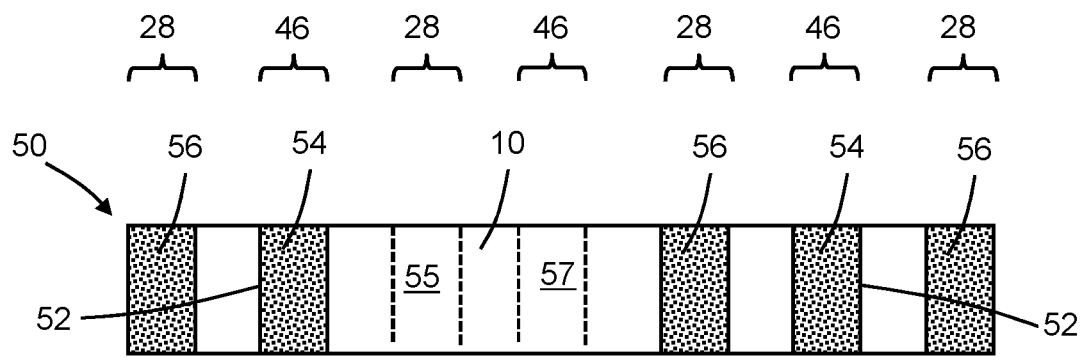
Figure 14:
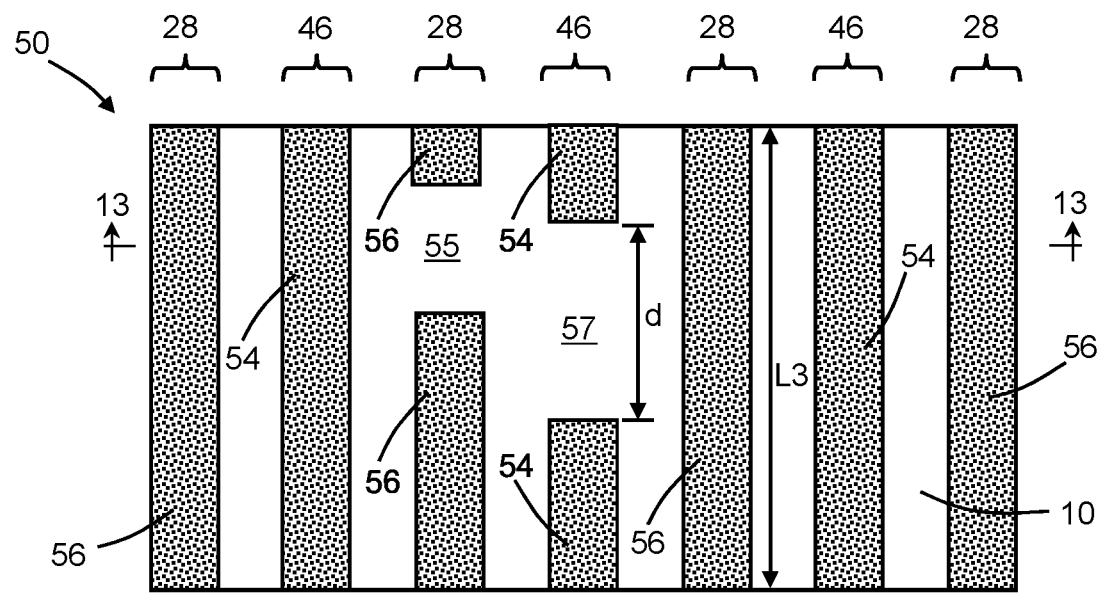

With reference to FIGS. 13, 14 in which like reference numerals refer to like features in FIG. 12 and at a subsequent fabrication stage of the processing method, the interlayer dielectric layer 10 is then patterned by an etching process with the patterned hardmask 12, and optionally the patterned hardmask 14, operating as an etch mask to transfer the pattern of non-mandrel lines 28 and mandrel lines 46 with cuts to the hardmask 12 to the interlayer dielectric layer 10 as trenches 52. A back-end-of-line interconnect structure 50 is formed by filling the trenches 52 in the interlayer dielectric layer 10 with one or more conductors to form interconnects 54, 56 as features in the form of wires that are embedded in the interlayer dielectric layer 10. The interconnects 54 are formed in the interlayer dielectric layer 10 along the mandrel lines 46 in the transferred pattern, and the interconnects 56 are formed in the interlayer dielectric layer 10 along the non-mandrel lines 28 in the transferred pattern.

The primary conductor of the interconnects 54, 56 may be composed of a low-resistivity metal formed using a deposition process, such as copper (Cu) or cobalt (Co) deposited by, for example, electroplating or electroless deposition or chemical vapor deposition. A liner (not shown) composed of titanium (Ti), titanium nitride (TiN), tantalum (Ta), tantalum nitride (TaN), or a layered combination of these materials (e.g., a bilayer of TaN/Ta) may be applied to the trenches 52 before filling with a primary electrical conductor. In an embodiment, the interconnects 54, 56 may be conductive features located in a metallization level that is the closest of multiple metallization levels of the back-end-of-line interconnect structure 50 to the device structures and substrate, and in which the interconnects 54, 56 may be connected with the device structures by contacts in an intervening contact level.

The interlayer dielectric layer 10 includes a non-mandrel cut 55, which are arranged between a pair of the interconnects 56, that represents a preserved section of dielectric material of the interlayer dielectric layer 10 masked by a section of the hardmask 12 during the etching process that was formerly covered by the non-mandrel cut mask 30. The interlayer dielectric layer 10 also includes a mandrel cut 57, which is arranged between a pair of the interconnects 54, that represents a preserved section of dielectric material of the interlayer dielectric layer 10 masked by a section of the hardmask 12 during the etching process that was formerly covered by the block mask 44. The interconnects 54 have a tip-to-tip spacing, d, between their respective tips or ends given by a length dimension of the mandrel cut 57 parallel to the length, L3, of the interconnects 54.

The tip-to-tip spacing for the mandrel cut 57 is not limited to a distance equal to twice the thickness of the sidewall spacers. Because the mandrel cut 57 is formed using the block mask 44 instead of the sidewall spacers 26, the tip-to-tip spacing of the interconnects 54 can exceed this spacer-related distance without any susceptibility to shorting the interconnects 54, 56. The tip-to-tip spacing for the mandrel cut 57 is a variable space that can be selected as part of the device design. In addition, because the sidewall spacers 26 do not have to wrap about the tips of the sections of the cut mandrel, indents are absent that could otherwise produce metal asperities projecting from the side edges of the interconnects adjacent into the mandrel cut 57.

Figure 15:
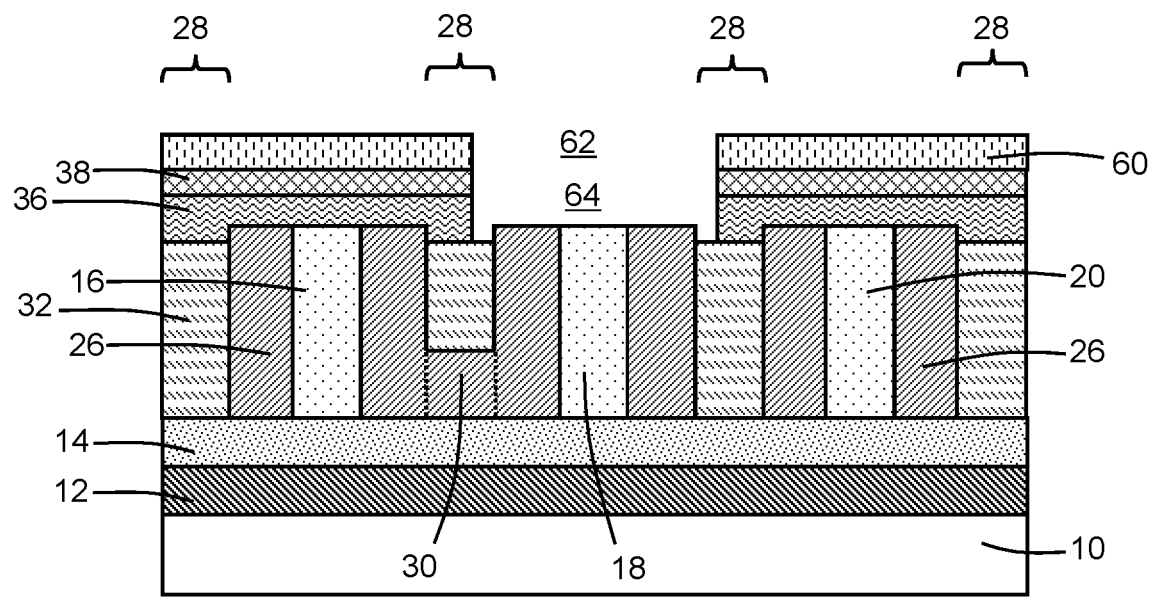
FIGS. 15-17 are cross-sectional views of a structure at successive fabrication stages of a processing method in accordance with alternative embodiments of the invention.

With reference to FIG. 15 in which like reference numerals refer to like features in FIG. 4 and in accordance with an alternative embodiment of the processing method, the patterning layer 36 and hardmask layer 38 are formed over the mandrels 16, 18, 20, sidewall spacers 26, and spin-on hardmask 32, and the mask layer 34 is omitted. An etch mask 60, which has a width and a length transverse to the width, is formed over the layers 36, 38 and a section of the mandrel 18 by a lithography process. The etch mask 60 may include a layer stack containing a negative-tone photoresist and a bottom anti-reflection coating in which the negative-tone photoresist may be applied as a fluid by a spin coating process, pre-baked, exposed to light projected through a photomask, baked after exposure, and developed with a chemical developer, and in which the bottom anti-reflection coating may be applied before the photoresist is applied and patterned after the photoresist is developed. The etch mask 60 includes an opening 62 that exposes an area (e.g., a rectangular area) on the top surface of the hardmask layer 38.

An opening 64 is formed that extends through the patterning layer 36 and hardmask layer 38 to expose or reveal a lengthwise section of the mandrel 18. The opening 62 in the etch mask 60 provides the pattern for forming the opening 64 during the etching process. Only a fraction of the length of the mandrel 18 is exposed by the opening 64. The opening 64 in the etch mask 60 overlaps in width dimension at its side edges with the sidewall spacers 26 adjacent to the masked (i.e., covered) lengthwise section of the mandrel 18 to ensure that the entire width of the lengthwise section 18a (FIG. 7) of the mandrel 18 is exposed.

Figure 16:
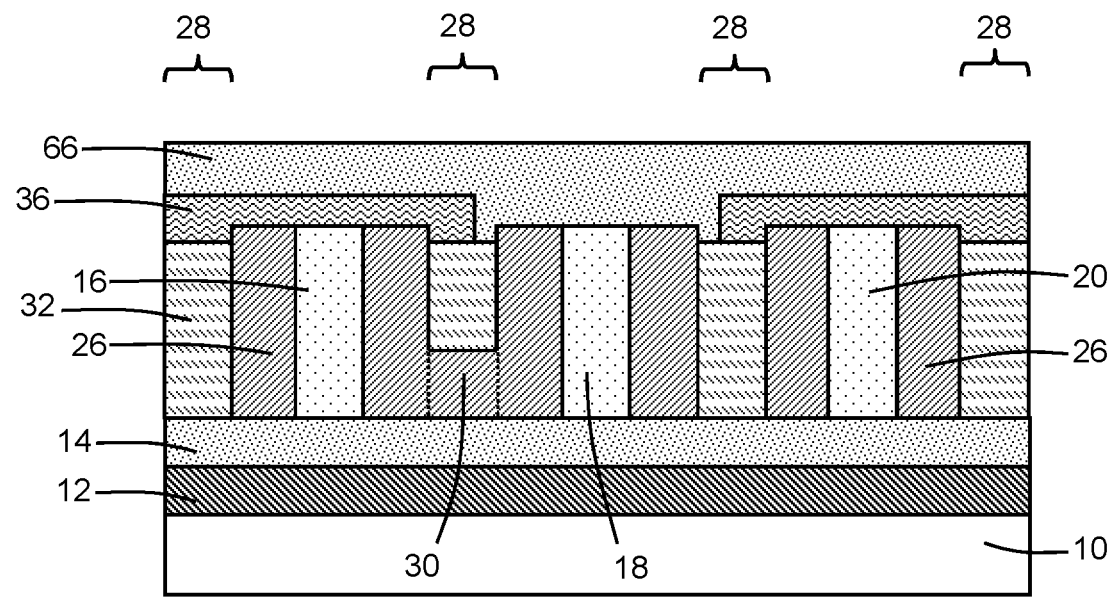

With reference to FIG. 16 in which like reference numerals refer to like features in FIG. 15 and at a subsequent fabrication stage of the processing method, the etch mask 60 is removed by, for example, ashing with an oxygen plasma, and the hardmask layer 38 may also be stripped with a wet chemical etch. A mask layer 66 may be formed by spin-coating to fill the opening 64 (FIG. 15). The mask layer 66 may be composed of, for example, a spin-on glass (SOG) that is applied and subject to a heat treatment to form a silicon oxide. Alternatively, the mask layer 66 may be composed of a different material, such as titanium oxide (TiO$_2$)

Figure 17:
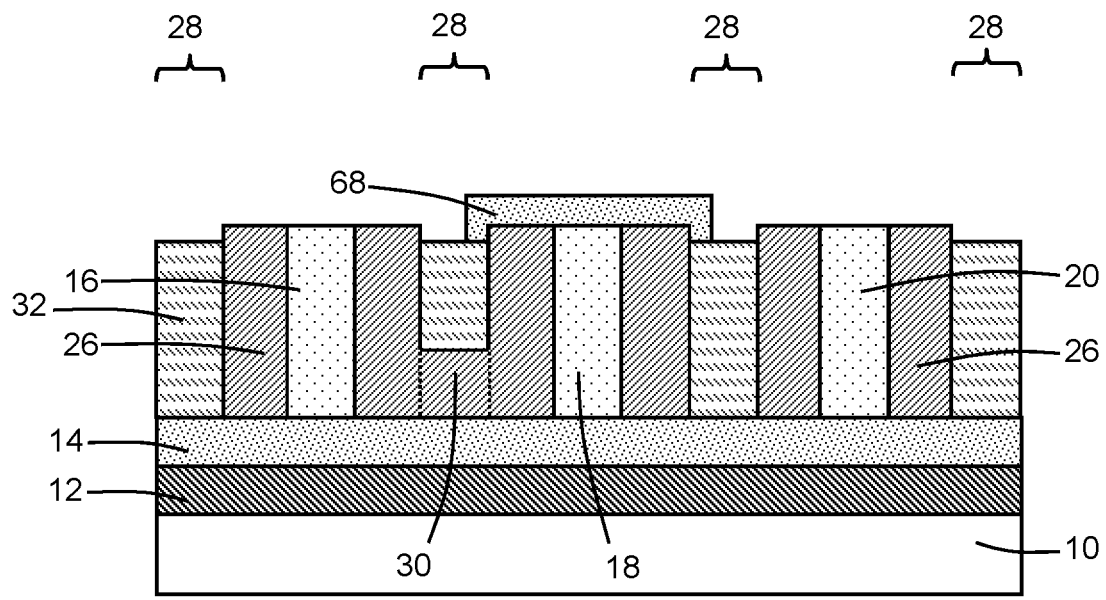

With reference to FIG. 17 in which like reference numerals refer to like features in FIG. 16 and at a subsequent fabrication stage of the processing method, a block mask 68 is formed by etching back the mask layer 66 with an etching process that removes the material of mask layer 66 selective to the material of the patterning layer 36. The patterning layer 36 is subsequently removed by, for example, ashing with an oxygen plasma. The block mask 68 covers and protects the lengthwise section 18a (FIG. 7A) of the mandrel 18 during mandrel pull to form the mandrel lines 46. The process flow continues as described in connection with FIGS. 8-14 with the block mask 68 covering the lengthwise section of the mandrel 18 during mandrel pull.

Figure 18:
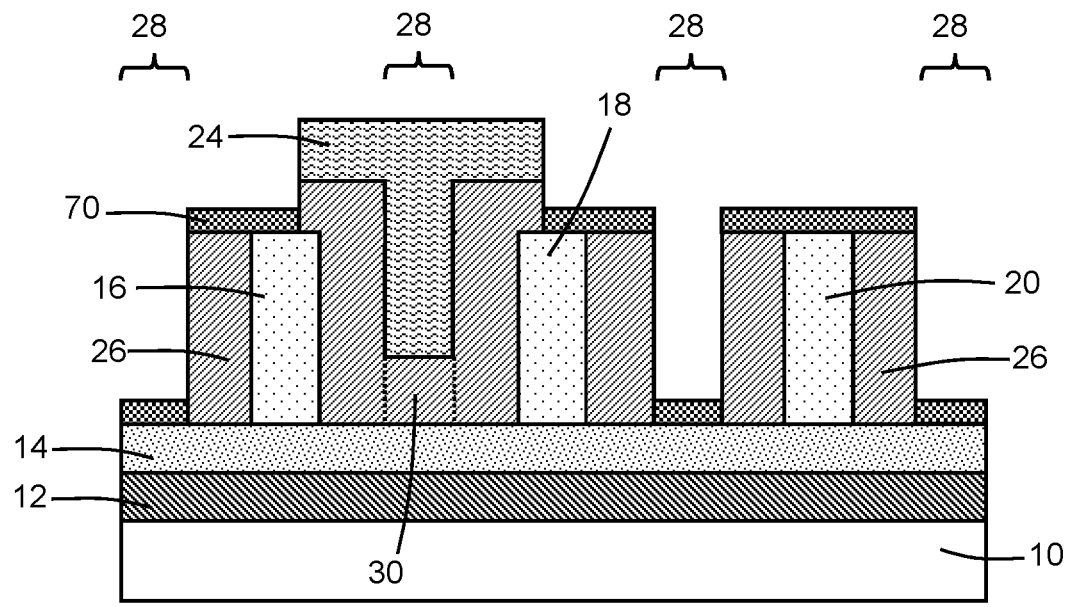
FIGS. 18-21 are cross-sectional views of a structure at successive fabrication stages of a processing method in accordance with alternative embodiments of the invention.

With reference to FIG. 18 in which like reference numerals refer to like features in FIG. 2 and in accordance with an alternative embodiment of the processing method, the etching process used to form the sidewall spacers 26 from the conformal spacer layer 22 may utilize an etching process with an etch chemistry that causes material from the organic material of the pillar 24 to be removed and transferred (i.e., transported) to be deposited as a mask layer 70. For example, the etch chemistry may be based on the use of a fluorine-containing gas, such as carbon tetrafluoride gas, as a source vapor/gas for the etching process. The deposited mask layer 70 has a different composition than the organic material constituting the pillar 24. The mask layer 70 may composed of, for example, a fluorine-containing polymer, such as polytetrafluoroethylene (PTFE). The mask layer 70 may be arranged over the mandrel 16, the sections of mandrel 18 that are not covered by the pillar 24 and underlying conformal spacer layer 22, and the pillar 24.

Figure 19:
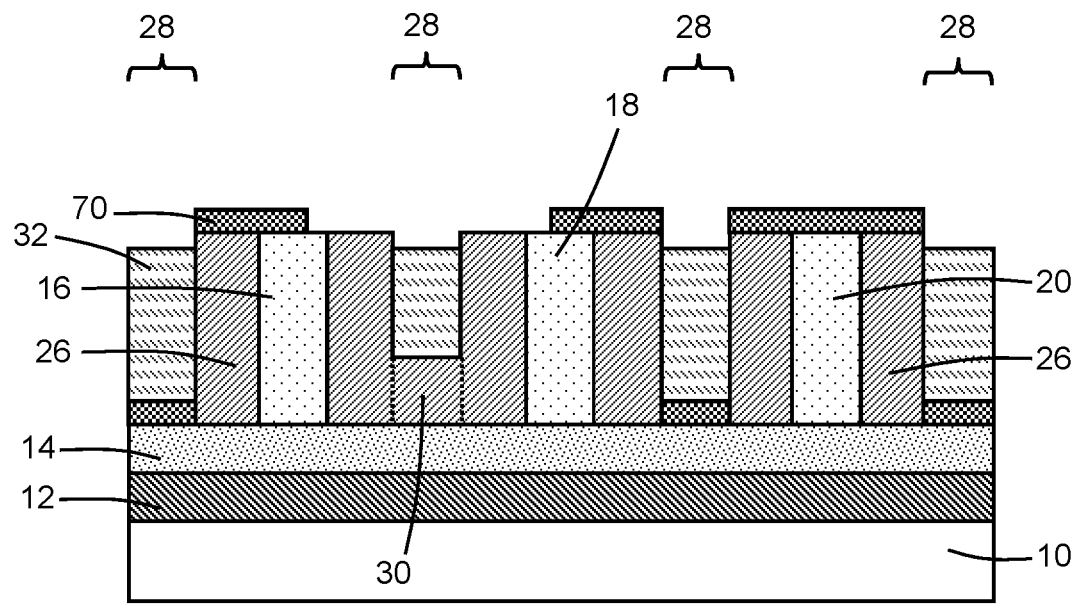

With reference to FIG. 19 in which like reference numerals refer to like features in FIG. 18 and at a subsequent fabrication stage of the processing method, the pillar 24 is removed, and the spin-on hardmask 32 is subsequently applied and recessed to fill the non-mandrel lines 28. After the spin-on hardmask 32 is formed, portions of the conformal spacer layer 22 over the mandrels 16, 18, which were partially covered by the pillar 24 during spacer formation, may be removed by an etching process that removes the conformal spacer layer 22 selective to the material contained in the mask layer 70.

Figure 20:
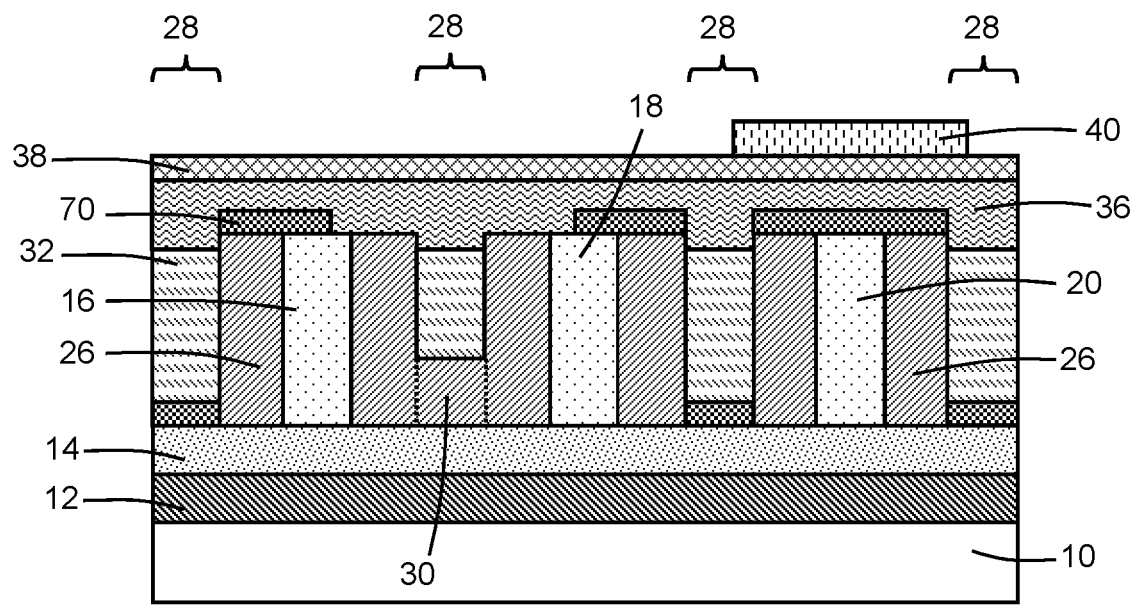

With reference to FIG. 20 in which like reference numerals refer to like features in FIG. 19 and at a subsequent fabrication stage of the processing method, the patterning layer 36 and hardmask layer 38 are formed, and patterned using the etch mask 40. In this instance, the etch mask 40 covers an area over the mask layer 70 that is arranged over a lengthwise section 20a (FIG. 21A) of the mandrel 20. Only a fraction of the length of the mandrel 20 is overlapped by the etch mask 40. The etch mask 40 overlap in width dimension at its side edges with the sidewall spacers 26 adjacent to the masked (i.e., covered) lengthwise section 20a of the mandrel 20 and the section of the mask layer 70 over the mandrel 20 and sidewall spacers 26 such that the entire width of the lengthwise section of the mandrel 20 is overlapped.

Figure 21:
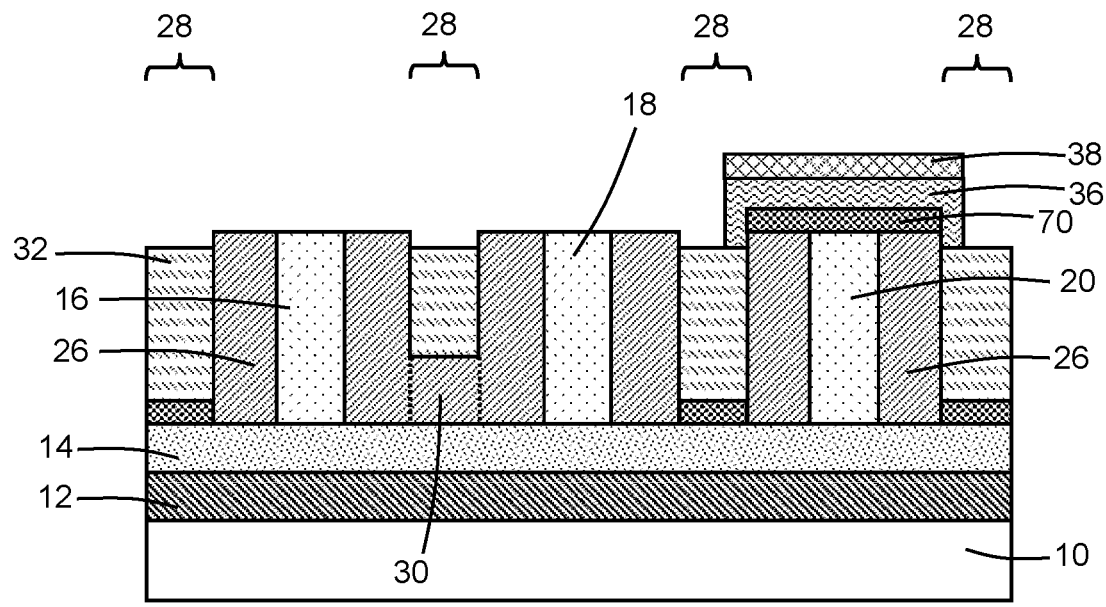
Figure 21A:
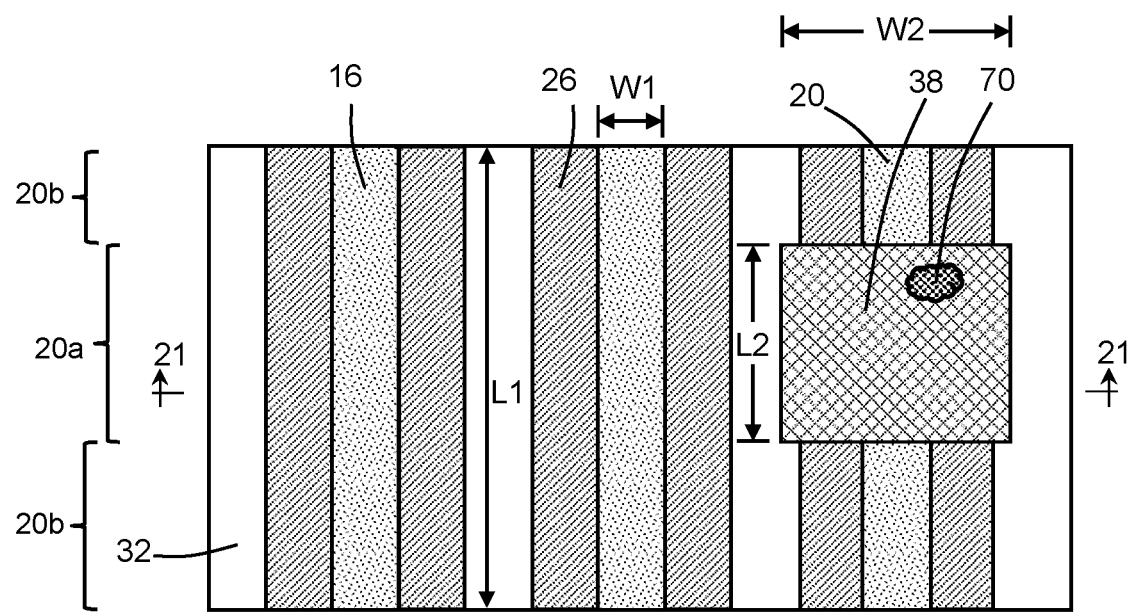

With reference to FIGS. 21, 21A in which like reference numerals refer to like features in FIG. 20 and at a subsequent fabrication stage of the processing method, the layers 36, 38 are patterned by an etching process, and the etch mask 40 is subsequently removed by, for example, ashing. The patterned layers 36, 38 are arranged over the section of the mask layer 70 covering the lengthwise section 20a of the mandrel 20 and its sidewall spacers 26. Sections of the mask layer 70 not masked by the patterned layers 36, 38 are removed. For example, the non-masked sections of the mask layer 70 may be removed when the etch mask 40 is removed. The process flow continues as described in connection with FIGS. 8-14 with the section of the mask layer 70 functioning as a block mask 68 covering the lengthwise section 20a of the mandrel 20 during mandrel pull, which removes the unmasked lengthwise sections 20b of the mandrel 20 adjacent to the masked lengthwise section 20a. Any remaining sections of mask layer 70 may be removed after the spin-on hardmask 32 and the layers 36, 38 are removed.

Figure 22:
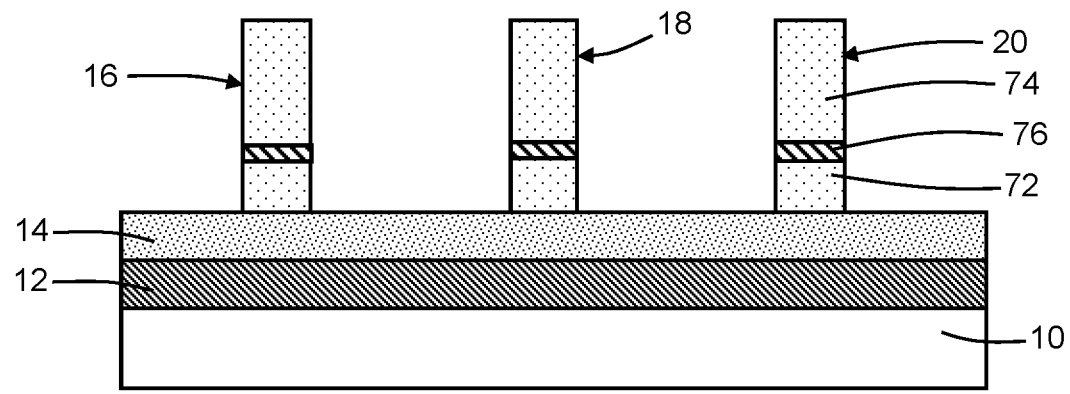
FIGS. 22-26 are cross-sectional views of a structure at successive fabrication stages of a processing method in accordance with alternative embodiments of the invention.

With reference to FIG. 22 in which like reference numerals refer to like features in FIG. 1 and in accordance with an alternative embodiment of the processing method, the mandrels 16, 18, 20 may be patterned with an etching process from a layer stack including multiple layers that are deposited on a top surface of the hardmask 14. Each of the mandrels 16, 18, 20 may include mandrel layers 72, 74 that are each composed of a spin-on material, such as amorphous silicon (a-Si). In addition, each of the mandrels 16, 18, 20 may include an etch stop layer 76 arranged between mandrel layer 72 and mandrel layer 74. The etch stop layer 76 may be composed of a dielectric material, such as silicon nitride or silicon dioxide, with etch selectivity to the material of the mandrel layers 72, 74.

Figure 23:
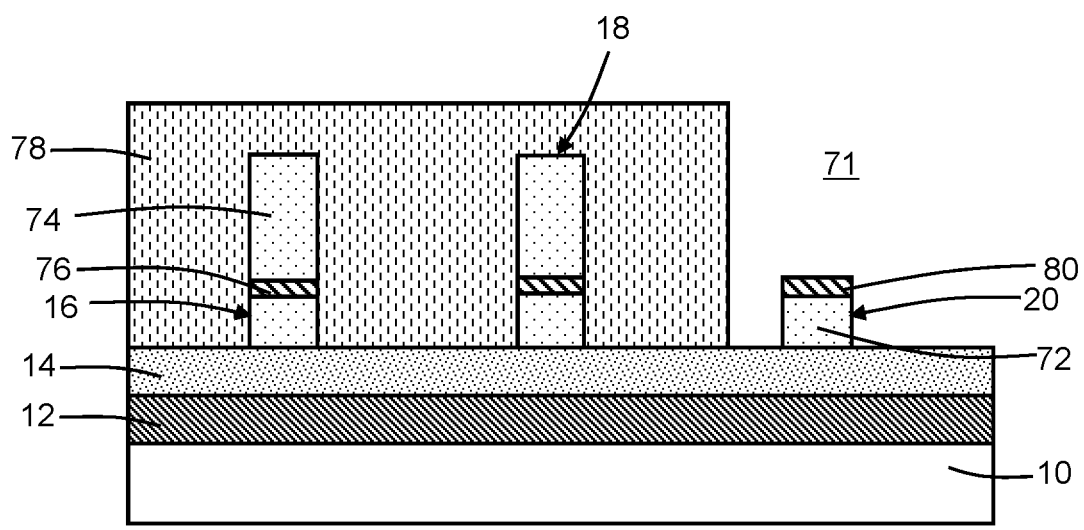

With reference to FIG. 23 in which like reference numerals refer to like features in FIG. 22 and at a subsequent fabrication stage of the processing method, an etch mask 78 is applied that includes an opening 71 that exposes the lengthwise section 20a (FIG. 21A) of the mandrel 20. An etching process is used to remove the upper mandrel layer 74 of the mandrel 20 over the lengthwise section 20a, which locally shortens the height of the mandrel 20. The chemistry of the etching process removing the material of the upper mandrel layer 74 is selected such that the etch stop layer 76 operates as an etch stop, which preserves the lower mandrel layer 72 of the lengthwise section 20a of mandrel 20. The etch stop layer 76 over the lower mandrel layer 72 of the lengthwise section 20a of mandrel 20 functions as a block mask 80. Outside of the opening in the etch mask 78, the adjacent lengthwise sections 20b (FIG. 21A) of the mandrel 20 retain their original height with the upper mandrel layer 74 retained due to masking by the etch mask 78 during the etching process.

Figure 24:
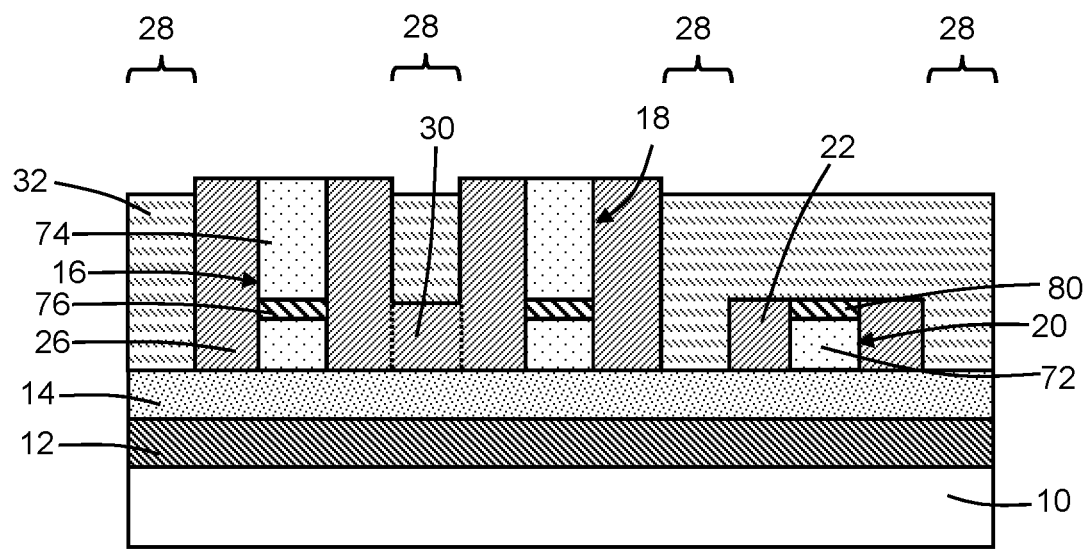

With reference to FIG. 24 in which like reference numerals refer to like features in FIG. 23 and at a subsequent fabrication stage of the processing method, the process flow continues as described in connection with FIGS. 2-4. When the spin-on hardmask 32 is applied and recessed to fill the non-mandrel lines 28, the sidewall spacers 26 and the shortened lengthwise section 20a of the mandrel 20 are buried in the spin-on hardmask 32. After the spin-on hardmask 32 is formed, portions of the conformal spacer layer 22 over the mandrels 16, 18, which were partially covered by the pillar 24 (FIG. 2) during spacer formation, are removed by an etching process. The block mask 80 and the sidewall spacers 26 adjacent to the shortened lengthwise section 20a of the mandrel 20 are covered and protected by the spin-on hardmask 32 during the etching process.

Figure 25:
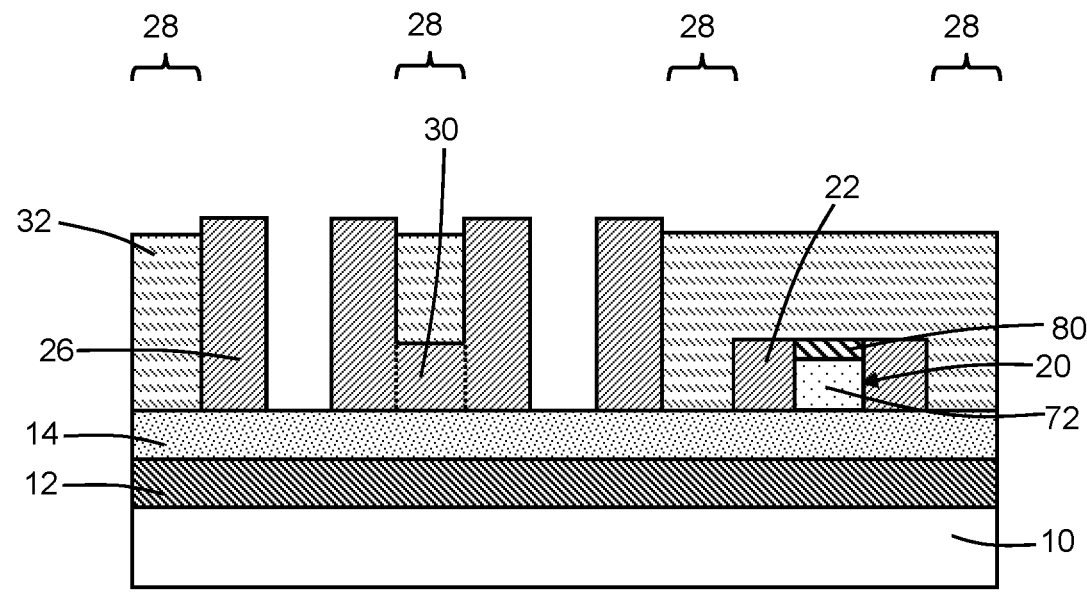

With reference to FIG. 25 in which like reference numerals refer to like features in FIG. 24 and at a subsequent fabrication stage of the processing method, the mandrels 16 and 18, as well the lengthwise sections 20b (FIG. 21A) of mandrel 20 that are arranged on opposite ends of the block mask 80, are removed with one or more etching processes that are selective to sequentially remove the mandrel layers 72, 74 and etch stop layer 76 as arranged in the layer stack. The mandrel lines 46 are arranged between the sidewall spacers 26 as linear spaces and over which strips of the hardmask 12 are revealed. The spin-on hardmask 32 masks and covers the block mask 80 over the lengthwise section 20a (FIG. 21A) of the shortened mandrel 20 during the etching process providing mandrel pulling. The block mask 80 and underlying unetched mandrel layer 72 in the lengthwise section of the mandrel 20 interrupt and cut the continuity of one of the mandrel lines 46, and divides this mandrel line 46 into discrete sections.

Figure 26:
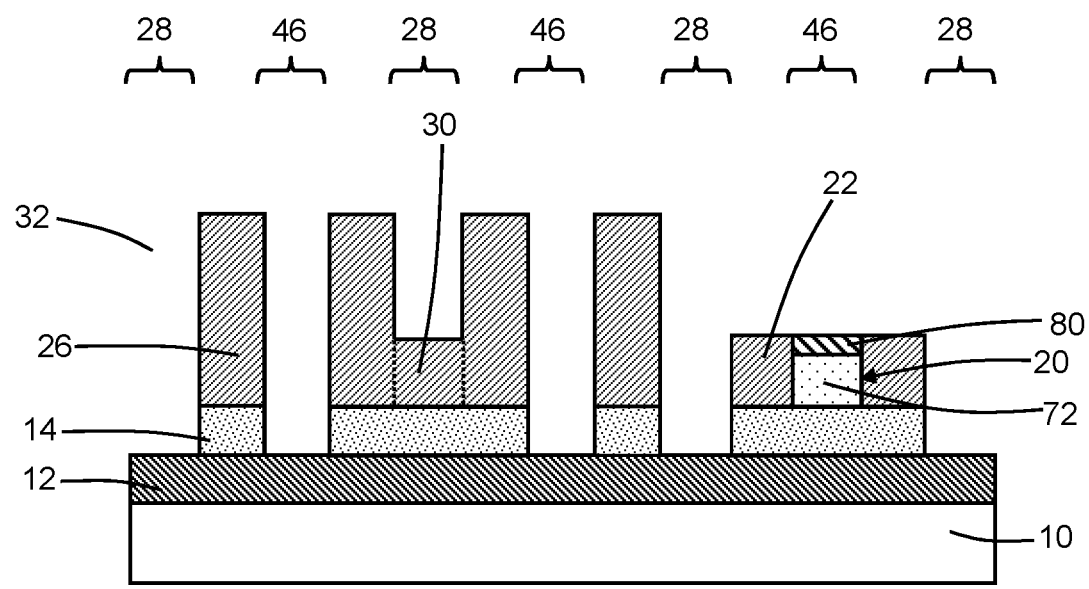

With reference to FIG. 26 in which like reference numerals refer to like features in FIG. 25 and at a subsequent fabrication stage of the processing method, the spin-on hardmask 32 is removed by, for example, ashing using an oxygen plasma. The pattern including the non-mandrel lines 28 and mandrel lines 46 is transferred to the hardmask 14 by an etching process while the block mask 80 and the unetched lengthwise section 20a (FIG. 21A) of the mandrel 20 mask a lengthwise portion of one of the mandrel lines 46 and the non-mandrel cut mask 30 masks a lengthwise portion of one of the non-mandrel lines 28. The non-mandrel lines 28 and mandrel lines 46 extend through the full thickness of the hardmask 14, and the material of the hardmask 12 may function as an etch stop for the etching process. The process flow continues as described in connection with FIGS. 12-14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms such as "vertical", "horizontal", "lateral", etc. are made by way of example, and not by way of limitation, to establish a frame of reference. Terms such as "horizontal" and "lateral" refer to a directions in a plane parallel to a top surface of a semiconductor substrate, regardless of its actual three-dimensional spatial orientation. Terms such as "vertical" and "normal" refer to a direction perpendicular to the "horizontal" and "lateral" direction.

A feature "connected" or "coupled" to or with another element may be directly connected or coupled to or with the other element or, instead, one or more intervening elements may be present. A feature may be "directly connected" or "directly coupled" to or with another element if intervening elements are absent. A feature may be "indirectly connected" or "indirectly coupled" to or with another element if at least one intervening element is present. A feature "on" or "contacting" another element may be directly on or in direct contact with the other element or, instead, one or more intervening elements may be present. A feature may be "directly on" or in "direct contact " with another element if intervening elements are absent. A feature may be "indirectly on" or in "indirect contact" with another element if at least one intervening element is present.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
depositing a hardmask over an interlayer dielectric layer;
forming a mandrel over the hardmask;
forming a conformal spacer layer on the hardmask and the mandrel;
covering a portion of the conformal spacer layer with a pillar containing a first organic material;
etching the conformal spacer layer with a first etching process to form a sidewall spacer adjacent to the mandrel, wherein the first etching process uses an etch chemistry based on a fluorine-containing gas;
forming a second organic material on the mandrel to provide a block mask that covers a first lengthwise section of the mandrel and that exposes a second lengthwise section of the mandrel and a third lengthwise section of the mandrel, wherein the second organic material is a fluorine-containing polymer;
removing the second lengthwise section and the third lengthwise section of the mandrel to define a pattern including a first mandrel line and a second mandrel line that is separated from the first mandrel line by the first lengthwise section of the mandrel covered by the block mask; and
transferring the pattern to the hardmask with a second etching process,
wherein the first mandrel line and the second mandrel line expose respective first portions of the hardmask, the first lengthwise section of the mandrel covers a second portion of the hardmask arranged between the first portions of the hardmask, and the first organic material is transferred by the first etching process from the pillar to cover the mandrel as the second organic material.

2. The method of claim 1 wherein the first organic material is different in composition from the second organic material.

3. The method of claim 1 wherein the fluorine-containing gas is carbon tetrafluoride, and the fluorine-containing polymer is polytetrafluoroethylene.

4. The method of claim 1 wherein forming the second organic material on the mandrel to provide the block mask that covers the first lengthwise section of the mandrel and that exposes the second lengthwise section of the mandrel and the third lengthwise section of the mandrel comprises:
transferring the second organic material to the first lengthwise section, the second lengthwise section, and the third lengthwise section of the mandrel; and
removing first sections of the second organic material respectively from the second lengthwise section and the third lengthwise section of the mandrel to provide the block mask covering the first lengthwise section of the mandrel.

5. The method of claim 4 further comprising:
forming a plurality of patterned layers on a second section of the second organic material covering the first lengthwise section of the mandrel before the first sections of the second organic material are respectively removed from the second lengthwise section and the third lengthwise section of the mandrel.

6. The method of claim 5 wherein the second section of the second organic material provides the block mask.

7. The method of claim 1 further comprising:
removing the block mask from the first lengthwise section of the mandrel.

8. The method of claim 7 wherein the block mask is removed after the second lengthwise section and the third lengthwise section of the mandrel are removed.

* * * * *